(12) United States Patent
Chillarige et al.

(10) Patent No.: US 10,338,137 B1
(45) Date of Patent: Jul. 2, 2019

(54) HIGHLY ACCURATE DEFECT IDENTIFICATION AND PRIORITIZATION OF FAULT LOCATIONS

(71) Applicant: Cadence Design Systems, Inc., San Jose, CA (US)

(72) Inventors: Sameer Chakravarthy Chillarige, Greater Noida (IN); Anil Malik, New Delhi (IN); Sharjinder Singh, Delhi (IN); Joseph Michael Swenton, Owego, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 44 days.

(21) Appl. No.: 15/215,261

(22) Filed: Jul. 20, 2016

(51) Int. Cl.
| G01R 31/3183 | (2006.01) |
| G01R 31/3181 | (2006.01) |
| G01R 31/3185 | (2006.01) |
| G01R 31/317 | (2006.01) |
| G01R 31/3177 | (2006.01) |
| G01R 31/3193 | (2006.01) |

(52) U.S. Cl.
CPC ............... *G01R 31/318307* (2013.01); *G01R 31/31813* (2013.01); *G01R 31/31835* (2013.01); *G01R 31/318314* (2013.01); *G01R 31/318357* (2013.01); *G01R 31/318547* (2013.01); *G01R 31/318569* (2013.01); *G01R 31/317* (2013.01); *G01R 31/3177* (2013.01); *G01R 31/3193* (2013.01)

(58) Field of Classification Search
CPC .......... G01R 31/318547; G01R 31/317; G01R 31/3177; G01R 31/31813; G01R 31/31835; G01R 31/318357; G01R 31/318569; G01R 31/3193
USPC ........................................................ 714/738
See application file for complete search history.

(56) References Cited

U.S. PATENT DOCUMENTS

| 5,737,340 | A  | * | 4/1998  | Tamarapalli ... | G01R 31/318342 714/733 |
| 6,618,830 | B1 | * | 9/2003  | Balachandran ... | G01R 31/3193 702/118 |
| 6,721,914 | B2 | * | 4/2004  | Bartenstein ... | G01R 31/317 714/25 |
| 6,836,867 | B2 | * | 12/2004 | Yonetoku ... | G01R 31/31813 714/738 |
| 7,386,778 | B2 | * | 6/2008  | Udell ... | G01R 31/318314 714/738 |
| 7,406,645 | B2 | * | 7/2008  | Nozuyama ... | G01R 31/31835 714/738 |
| 7,509,551 | B2 | * | 3/2009  | Koenemann ... | G01R 31/31703 714/732 |
| 7,840,862 | B2 | * | 11/2010 | Huang ... | G01R 31/3177 714/726 |
| 7,971,119 | B2 | * | 6/2011  | Hsu ... | G01R 31/318547 714/726 |

(Continued)

*Primary Examiner* — James C Kerveros
(74) *Attorney, Agent, or Firm* — Tarolli, Sundheim, Covell & Tummino LLP

(57) ABSTRACT

A method for defect identification for an integrated circuit includes determining a defect ranking technique, applying at least two defect identification techniques and generating a defect report corresponding to each technique, comparing the defect reports and generating probable defect locations, prioritizing the probable defect locations according to the defect ranking technique; and generating a report of the prioritized probable defect locations.

18 Claims, 7 Drawing Sheets

(56) References Cited

U.S. PATENT DOCUMENTS

| | | | | |
|---|---|---|---|---|
| 8,190,953 | B2* | 5/2012 | Chakravarthy | ............................ G01R 31/318371 714/726 |
| 8,280,687 | B2* | 10/2012 | Cheng | ............ G01R 31/318547 702/185 |
| 8,352,818 | B2* | 1/2013 | Goel | .............. G01R 31/318328 714/726 |
| 2007/0038911 | A1* | 2/2007 | Koenemann | ..... G01R 31/31703 714/732 |
| 2010/0088560 | A1* | 4/2010 | Chakravarthy | .. G01R 31/31718 714/724 |

* cited by examiner

Automatic analysis of diagnostics results for device : top

Fault consistency report across various callout scoring scheme:

| Rank | Top Scoring Fault | Fault Type | Scoring Scheme Sequence | Scoring Scheme Cycle | Scoring Scheme Fail | Detected in all scoring runs |
|------|-------------------|------------|------|-------|------|------|
| 1 | 317 | SA0 | y | y | y | y |
| 2 | 465 | SA0 | y | y | y | n |
| 3 | 2472 | SA0 | y | y | n | n |
| 4 | 303 | SA0 | n | n | y | n |
| 5 | 2349 | SA0 | n | y | y | n |
| 6 | 2350 | SA1 | n | y | y | n |
| 7 | 676 | SA1 | n | y | n | n |
| 8 | 318 | SA1 | n | n | y | n |

Fault 317 and Fault 465 are reported as Rank 1 and Rank 2

FIG. 6

HIGHLY ACCURATE DEFECT IDENTIFICATION AND PRIORITIZATION OF FAULT LOCATIONS

TECHNICAL FIELD

The field of the invention relates generally to hardware and software verification of logic circuits and more particularly relates to diagnosing failure locations in integrated circuits ("chips") and other complex electronic components.

BACKGROUND

After being fabricated, Integrated Circuits (ICs) are tested for proper functional operation and structural integrity using a set of test vectors that contain test inputs and the expected test outputs Test vectors generated by an Automatic Test Pattern Generation (ATPG) software are applied to the chip or device under test (DUT) by an Automatic Test Equipment (ATE). The ICs that successfully passed all the test vectors are qualified as good whereas the ICs that failed on any of the test vectors are qualified as bad or defective. For the defective ICs, the failure information is collected by the ATE and stored in a buffer for further processing using diagnostics tools.

Defects of a defective chip are located using the failure information obtained from the ATE and the test vectors applied to the defective chip as well as the design information with which the chip is fabricated. Diagnostics took, e.g. fault simulation on the failed patterns, are used to identify defective locations. The diagnosis process reports the fault type(s) and the corresponding location(s) that best match the failures observed by the ATE. The matching is typically done using a scoring formula that accounts for the number of predictions mis-predictions and non-predictions. The diagnostics tools are generally useful in identifying yield limners and possibly locating them on the defective IC to help chip designers to find the systematic defects in their designs and to improve them by fixing the cause of such failures.

It is extremely challenging to accurately determine the defect locations in a failing chip due to various reasons. The defect(s) may not behave as modeled faults or there are multiple defect locations in a failing chip. Multiple defects may interact with each other and produce a failing signature that does not match with the faults simulated individually using fault simulator or defect(s) excitation conditions is not met with the values on the neighboring nets. Further, as integrated circuits shrink in size and increase in complexity of design, the probability of having multiple defects in a single integrated circuit (IC) increases.

The diagnosis fault simulation will perform single fault simulation. Thus to determine the possibility of multiple defects, simulating all combinations of faults is impractical. There are some existing methods present to determine the multiple defects.

In one approach for determining multiple defects in an integrated circuit, a time intensive heuristic, e.g. greedy heuristic, for determining the smallest set of faults that explain the maximum number of failures is applied. Existing heuristic based greedy algorithms are often prone to false positives because a single pass is applied to determine the minimum fault set. If the faults during the defect identification process are chosen incorrectly, the final set of fault candidates identified will be incorrect.

Another approach determines multiple defects by back tracing from failing flops, determining the non-overlapping back-cones of logic, and then partitioning the failures. Each partition of failures is assumed to be caused by different sets of defects. The failures are partitioned based on the failing flops whose feeding logic is not overlapping and then perform diagnostics are performed on a separate set of partitioned clusters. This approach may not always lead to successful partition of failures because for overlapping defects, this results in a single cluster of failures. The probability that multiple defects lie physically very near is high and thus their chance of feeding the same failing flops (overlapping logic) is also very high. Therefore, the probability of partitioning the failures caused by multiple defects is not very good. The circuit based fail partitioning doesn't work for compression test modes because in compression test modes the data coming out from scan chains are compressed and getting the list of actual failing flops is very time consuming. Without knowing the list of actual failing flops, the failures cannot be partitioned.

In the above approaches, a single scoring scheme is applied to rank the fault candidates. Faults with inconsistent explanation may get higher rank than the faults with consistent explanation in a different scoring scheme. To illustrate, a fault with an inconsistent explanation is one that does not explain all failures in a failing pattern while a fault with a consistent explanation is one that explains all failures in the failing pattern.

A single scoring formula is applied to determine the score of a fault. This may result in incorrect faults getting higher scores since the scoring formula applied may not be appropriate.

The score is calculated on all the patterns (sequences) simulated. This can result in incorrect faults getting a higher score because an undetected fault is not excited in passing patterns or the failing patterns fail due to random defects. A passing pattern is one where no faults were identified while a failing pattern is one where faults were identified.

The aforementioned approaches are heuristic-based and can produce false positives. A single canned algorithm is applied to determine defect locations. The accuracy of the final results depends on the accuracy of the applied algorithm and alignment of input data to the algorithm. The propagation of error from the defect identification process will cause a significant loss of time during the physical failure analysis and the yield ramp process slows down.

There is therefore a need for a better system or method to minimize the chance of false positives and accurately identify all the multiple defects for all design chips and prioritize or rank the fault locations with their best probability.

BRIEF DESCRIPTION OF THE DRAWINGS

FIG. 6 shows an illustrative example of a callout report showing the fault ranking.

DETAILED DESCRIPTION

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

A method for defect identification for an integrated circuit includes determining a defect ranking technique, applying at least two defect identification techniques and generating a defect report corresponding to each technique, comparing the defect reports and generating probable defect locations, prioritizing the probable defect locations according to the defect ranking technique; and generating a report of the prioritized probable defect locations. The defects may be identified by a measure location or a failure. A measure location is a location on the chip where faulty or bad values are recorded or measured. A failure is the faulty match recorded for a measure location or output in a given pattern.

Figure 1:
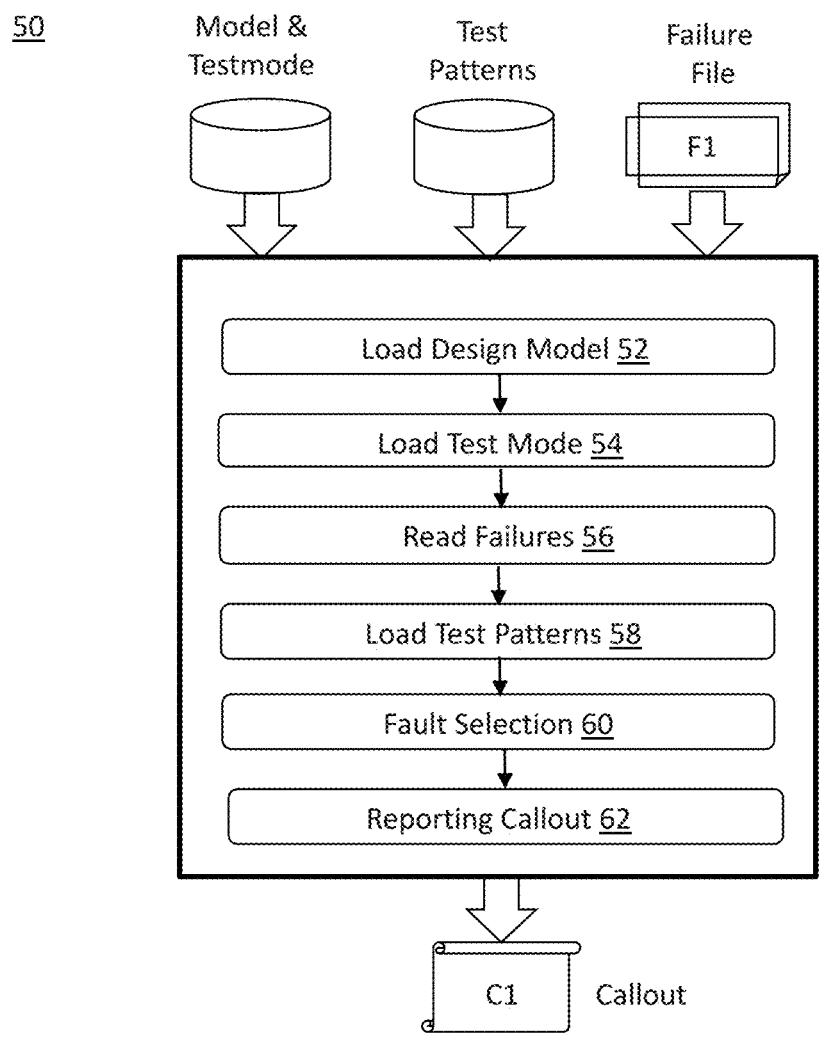
FIG. 1 is a flowchart 50 corresponding to the defect analysis of the prior art.

FIG. 1 is a flowchart 50 corresponding to the failure diagnosis of a failing circuit in the prior art. In step 52, the design model is loaded into the diagnostics program. In step 54, the test mode is loaded into the diagnostics program. In step 56, the failures are loaded into the diagnostics program. In step 58, the test patterns are loaded. In step 60, a fault selection process is performed to identify an initial list of suspect locations. In step, 62, the results are reported.

Figure 2:
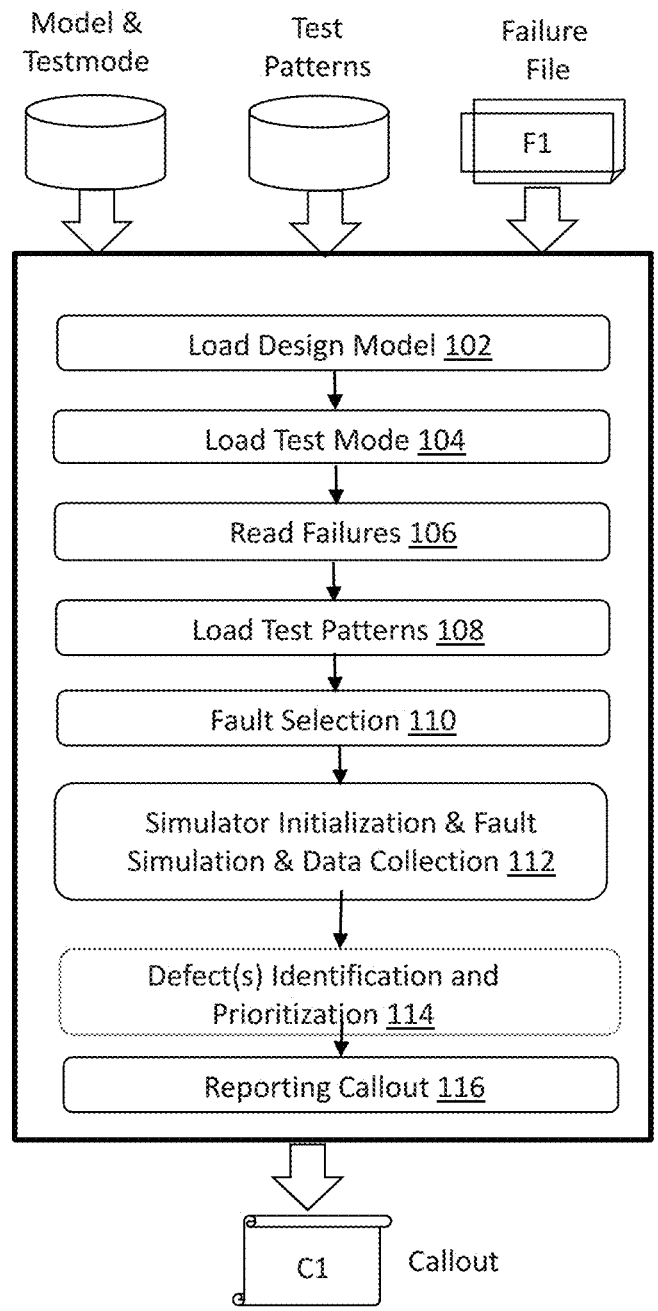
FIG. 2 is a flowchart 100 corresponding to an embodiment of the invention.

FIG. 2 is a flowchart 100 corresponding to an embodiment of the invention for diagnosing a failing integrated circuit. In step 102, the design model is loaded into the diagnostics program. In step 104, the test mode is loaded into the diagnostics program. In step 106, the failures are loaded into the diagnostics program. In step 108, the test patterns are loaded. In step 110, a fault selection process is performed to identify an initial list of suspect locations. In step 112, the simulator is initialized and fault simulation occurs on all the selected faults. The simulator then identifies the list of failing locations for each simulated fault. In an embodiment of the present invention, the data collection for each fault is done such that the scoring can be calculated on various patterns, scoring schemes and scoring formulae. In step 114, the proposed defect identification and prioritization algorithm is then applied on the data collected (in step 112) and a ranked or prioritized list of best fault candidates are identified. In an embodiment of the present invention, the defect identification and prioritization algorithm is defined by the user or alternately, selected from a list. The list may be a look-up table (not shown) that indicates for each fault simulation, a weight or prioritization for the detected faults. In step 116, the results are reported.

Fault simulation of the entire fault set for a given test pattern set determines which faults are detected by the test pattern set and which are not detected. The fault detection data is then used to determine the percentage of detected faults associated with the IC when the test pattern set is applied to the IC. The percentage of detected faults is referred to as fault coverage and the process of estimating fault coverage is referred to as fault grading.

Fault grading techniques or scoring schemes can be sub-divided into three major categories: exhaustive, statistical and probabilistic. Exhaustive methods evaluate all faults associated with the IC via fault simulation to perform fault grading. The statistical approach randomly samples the list of faults, evaluating the sample set of faults using fault simulation, and calculating a point estimate for fault coverage. The probabilistic method is based on measuring the observability and controllability of the signals in the IC for a given set of test patterns.

The probabilistic method is computationally inexpensive to perform. As a result, a fault coverage estimate can be determined in a fraction of the amount of time required to perform fault grading using exhaustive or statistical approaches. A drawback to probabilistic fault grading is that it is a challenge to determine the accuracy of the fault coverage estimate.

In embodiments of the present invention, evaluating and comparing scoring schemes for the probabilistic approach are added to the fault grading process. Score calculations for a fault are highly dependent on which scoring scheme is used. The failing defect locations are evaluated in multiple scoring schemes, e.g. per-fail, per-cycle, and per-sequence. At present, a single scoring scheme is used for determining the failing defect locations. In embodiments of the invention, fault identification accuracy is improved by scoring a fault using at least two different scoring schemes.

For the "per-fail" scoring analysis, the faults are scored on a failure by failure basis. In this scoring scheme, a failure location (where failure is measured) in a given test pattern is considered as a single entity and that single entity is marked as explained only if a fault creates a bad value at that measure location and matches the faulty behavior of the actual failing chip at that measure location in a given test pattern. Credit is given to a fault when it explains a failing location in the failing pattern. The score for each fault is then calculated based on the number of credits for all explained failures and the number of credits for non-predictions or contradiction data (failures which were not triggered in the failing chip).

For the "per-cycle" analysis, faults are scored on a cycle by cycle basis. In this scoring scheme, a set of failing measure locations measured in a given single scan clock cycle in a given test pattern is considered as single entity and this single entity is marked as explained only if all the failing measure locations or failures exactly matches the faulty test behavior of the actual failing chip in that single scan clock cycle for a given test pattern. A partial match of failing measure locations or failures in a given failing cycle is not considered an exact match and no credit is given to a fault for that set of failing measure locations. Credit is given to a fault when it explains all failures in a failing scan clock cycle in the failing pattern. The score for each fault is then calculated based on the number of credits for all explained failing scan clock cycles and the number of credits for non-predictions or contradiction data (scan clock cycles which failed in simulation but no failures were measured or recorded for the actual failing chip).

For the "per-sequence" or "per pattern" analysis, faults are scored on a pattern by pattern basis. In this scoring scheme, all the failing measure locations measured in a given failing test pattern or test sequence are considered as a single entity and this single entity is marked as explained when all the failing measure locations or failures match the faulty test behavior of the actual failing chip in that given test pattern. A partial match of failing measure locations or failures in a given failing test pattern is not considered an exact match and no credit is given to a fault for that set of failing measure locations. Credit is given to a fault when it explains all failures in the failing pattern. The score for each fault is then calculated based on the number of credits for all explained failing test patterns and the number of credits for non-predictions or contradiction data (test patterns which failed in simulation but no failures were measured or recorded for the actual failing chip).

Figure 3:
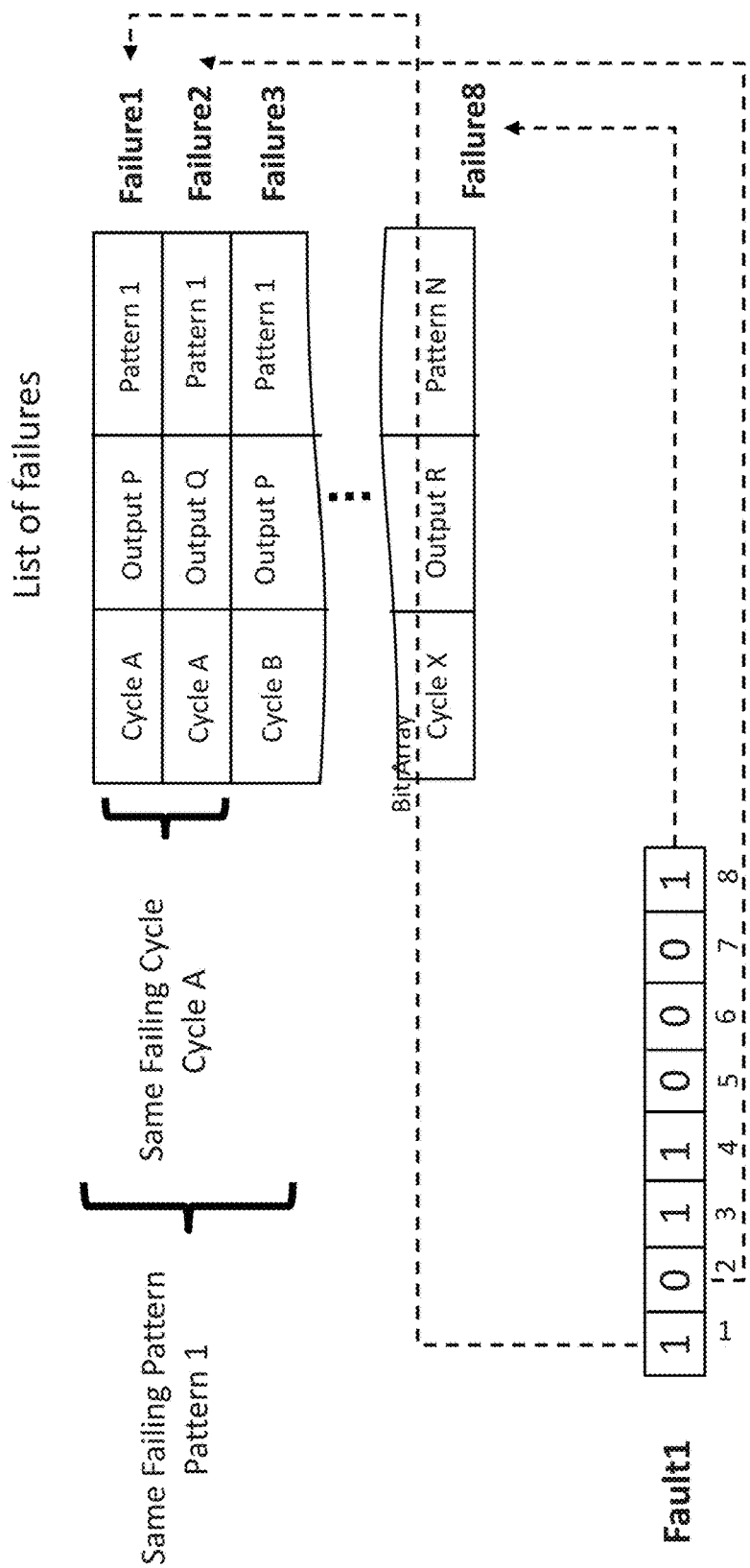
FIG. 3 shows that the data collection for each fault is done using a bit array.

FIG. 3 shows that the data collection for each fault using a bit array. It represents the sample type of data structure used to record or organize the simulation data for all simulated faults. The simulation data may be recorded in the other types of data structures such that information regarding individual failures and contradiction data explained for all simulation faults may not lose any valuable information. The index of the bit array maps to the actual failure location. The values reflect how well the defects determined by the fault simulator match the test behavior. The contradiction data associated with the fault is stored on a per-cycle scoring scheme basis to allow the calculation of the score in all scoring schemes.

Test patterns are injected into the fault simulator to recreate the defect found in ATE. In this illustrative example, a value of "1" indicates that the failure could be caused by the fault while a value of "0" indicates that the failures cannot be caused by the fault. A bit array is generated for each fault per simulation scheme.

In this illustrative example, a fault having "1"s as the bit array values indicates that the simulated fault matches the tester behavior for the actual failing chip. A value '1' in a bit array represents that failure mapped to that bit position is explained (simulation failure matches the tester behavior for the failing chip) by the simulated fault. In this example of bit array the fault 'fault1' explains the tester failures 'failure1', 'failure3', 'failure4', 'failure8'. This means the fault "fault1" matches the faulty behavior for failures 'failure1', failure3', 'failure4', 'failure8' recorded at tester for failing chip, but does not produce any failure which matches the faulty behavior for failures 'failure2', 'failure5', 'failure6', 'failure7' recorded at the tester for the failing chip. As part of the scoring process, the type of analysis may be weighted or prioritized. To illustrate, the defects identified by per pattern are given more weight than those identified by per-cycle or by per-fail.

Figure 4:
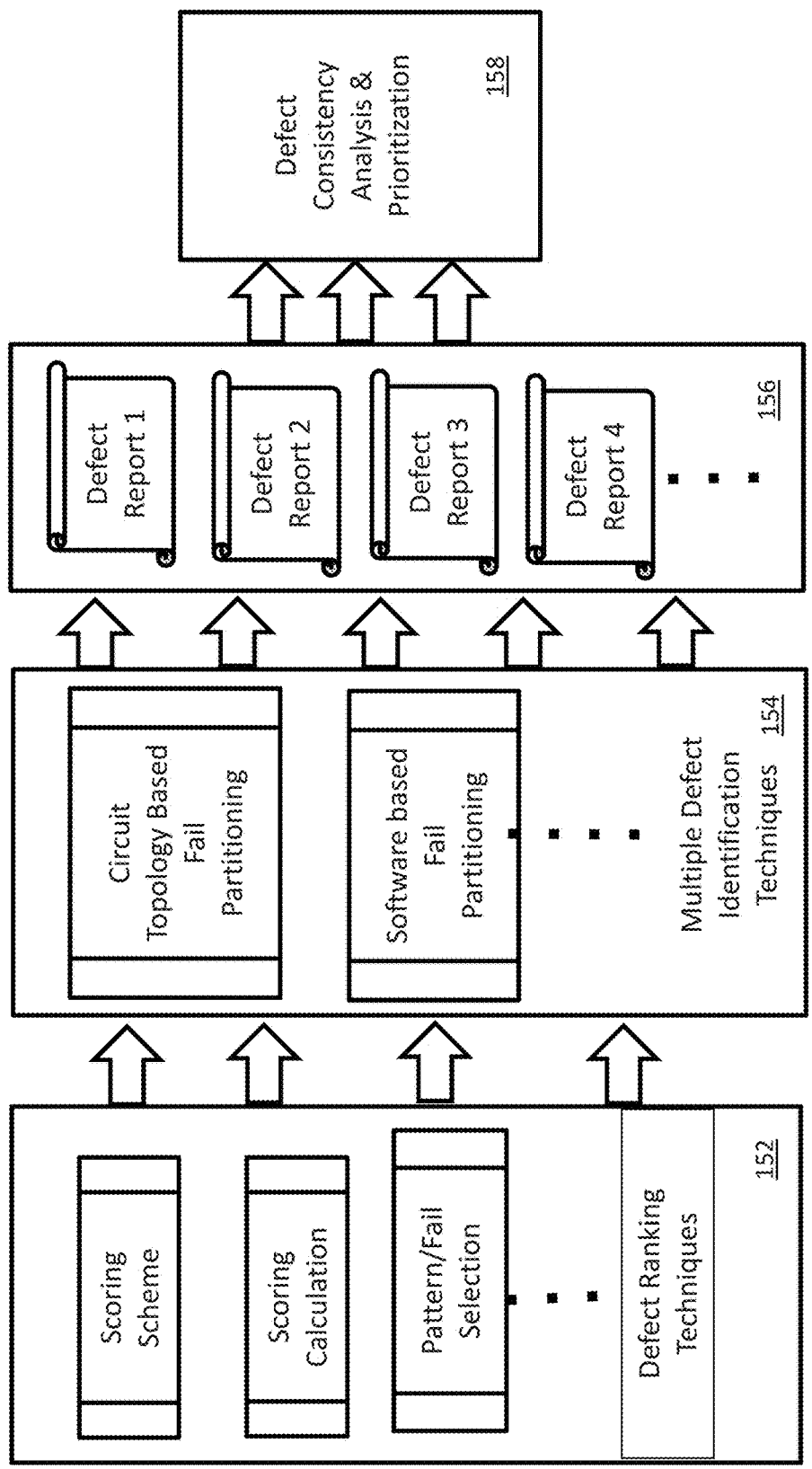
FIG. 4 illustrates the process according to an embodiment of the invention.

FIG. 4 illustrates the process corresponding to an embodiment of the invention. This figure represents the flow performed after simulation on the data collected during simulation process. In a first stage 152, the defect ranking techniques are identified according to a variety of parameters. The parameters include but are not limited to scoring schemes, scoring formulae, patterns simulated. To illustrate, each scoring scheme, "per-fail", "per-cycle", and "per-sequence" (per pattern) are prioritized or given different weightings.

In a second stage 154, the available defect identification techniques include but are not limited to circuit topology based fail partitioning and software based fail partitioning. Embodiments of the present invention perform exploration based defect identification through multiple iterations. Each iteration operates on a scoring scheme, scoring formula, and set of patterns and applies the set-cover based multiple defect identification or circuit topology based fail partition or any other technique to determine multiple defects and determines the probable defect locations. This stage identifies multiple defects in each scoring scheme while performing multiple iterations of defect identification techniques.

In a third stage 156, all the faults detected in multiple iterations of defect analysis with different scoring schemes are accumulated in one place which is then fed to fourth stage 158. Embodiments of the present invention identify fault locations that are missed by applying a single fault detection approach. Embodiments of the present invention collect data during fault simulation in a memory in a performance efficient manner such that defect locations can be identified through multiple iterations in the same process. The program can be designed to determine a minimum number of iterations automatically based on the results obtained in each successive iteration.

In an illustrative example, different fault simulation techniques are applied to the same chain of flip-flops. In another example, different sets of test vectors are applied to a chain of flip-flops using the same fault simulator.

In fourth stage 158, a fault consistency analysis is performed on the probable defect locations identified within each iteration. The final ranked order is reported to the user. Embodiments of the present invention perform consistency analysis across multiple defect reports and ranks the fault locations based on their consistency and failure explanation. This allows prioritization of Physical Failure Analysis for the faults reported. Since the final callout report reflects the cross-correlation of multiple defect reports, the chances of false positives are reduced.

The user can select the time limit to perform the iterations. The reliability of the identified defect locations increases with the time given to the defect identification program.

Figure 5:
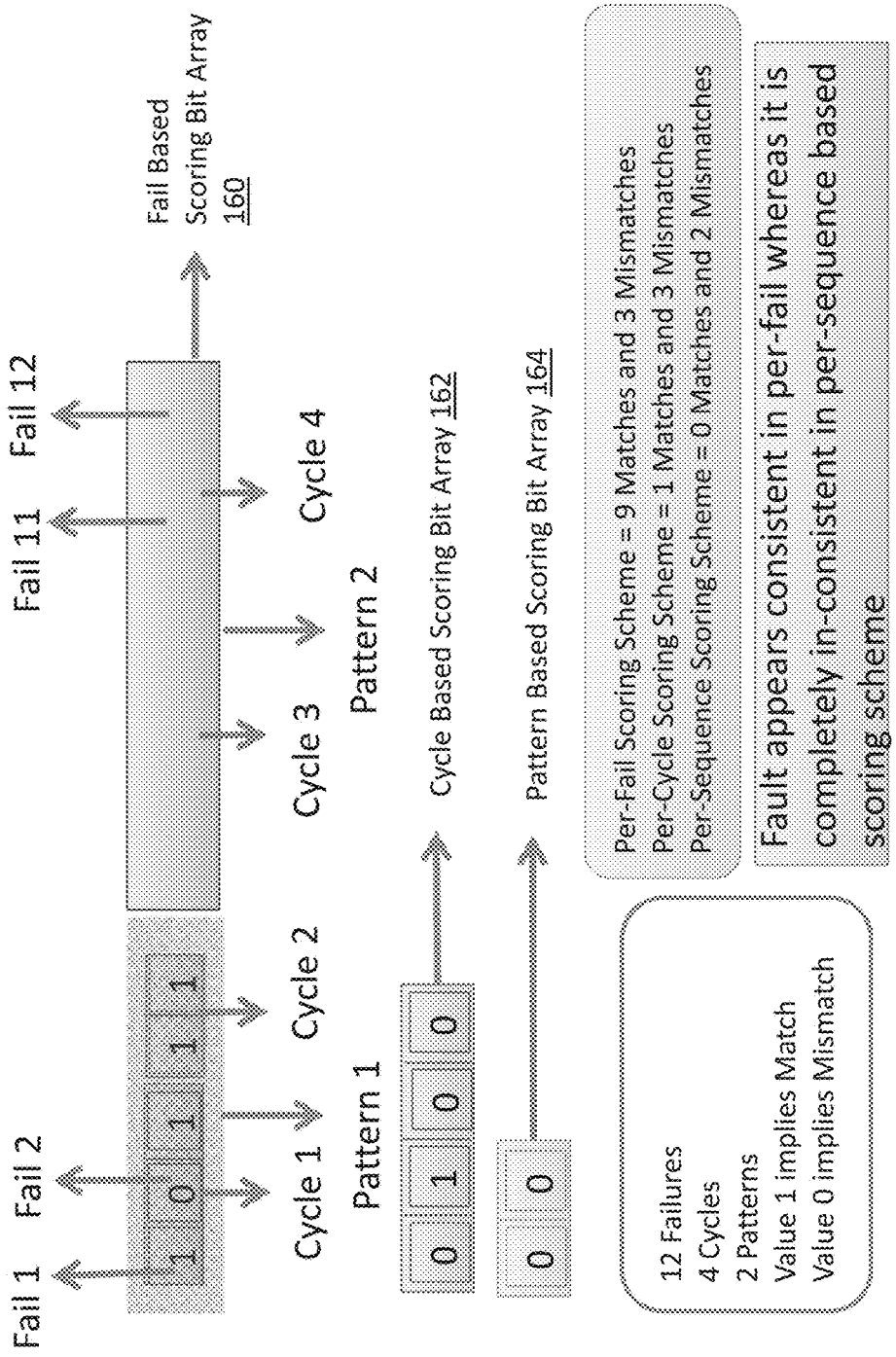
FIG. 5 illustrates the process corresponding to an embodiment of the invention.

FIG. 5 is an illustrative example of fault scoring in various scoring schemes. For a given defect, there is a per-fail based scoring bit array 160, a per-cycle based scoring bit array 162, and a per pattern (sequence) based scoring bit array 164. For the per-fail-based scoring bit array 160, there are 9 matches, e.g. "1" s, and 3 mismatches, e.g. "0" s. For the per-cycle-based scoring bit array 162, there is 1 match and 3 mismatches, e.g. "0" s. For the per pattern (sequence)-based scoring bit array 164, there are 0 matches and 2 mismatches.

The fault appears consistent in per-fail whereas it is not found when evaluating the per-sequence based scoring scheme. For a system, where per-fail-based scoring results are given less weight than per-cycle and per pattern (sequence) results, this corresponding defect location would be reported with less credence than a defect where all scoring schemes indicated the defect location.

FIG. 6 shows an illustrative example of a callout report showing the fault ranking. In this example, the scoring schemes were prioritized from highest to lowest as per-sequence, per-cycle, and per-fail. Fault 317, Fault 465, and Fault 2472 are reported as Rank 1, Rank 2, and Rank 3 respectively. Fault 317 is a stuck-at-0 (SA0) fault. It was detected in all the scoring runs. It was reported as a fault detected under all the scoring schemes applied. Fault 465 is also a SA0 fault. It was reported as a fault detected only under the per-sequence and per-cycle scoring schemes. Fault 465 was not detected in all of the scoring runs. Faults detected in all scoring runs will rank with higher priority, thus fault 317 is ranked as a higher fault than Fault 465. Fault 2472 is also a SA0 fault. It was reported as a fault detected only when the per-sequence and per-cycle scoring schemes were applied. Fault 2472 was not detected in all of the scoring scheme runs. Fault 2472 is ranked lower than Fault 465 as it was not detected in more of scoring scheme runs.

Faults 303 and 2349 are SA0 faults. Faults 2350, 676, and 318 are stuck-at-1 (SA1) faults. These faults were not considered actual defect locations as per-sequence scoring scheme had the highest priority.

The callout report may display the faults corresponding to the actual defect locations by highlighting in color or outlining the group of faults. Alternately, only the actual defect locations are displayed in the report.

While the ranking of the scoring schemes has been described individually, the concept can be extended to include a scoring scheme that is a composite of per-sequence, per-cycle, and per-fail. To illustrate, a fault location that appears in two scoring schemes, e.g. per-cycle and per-fail, could be reported as a defect location. The concept can be extended to include a scoring scheme that includes ranking the fault simulation techniques.

Figure 7:
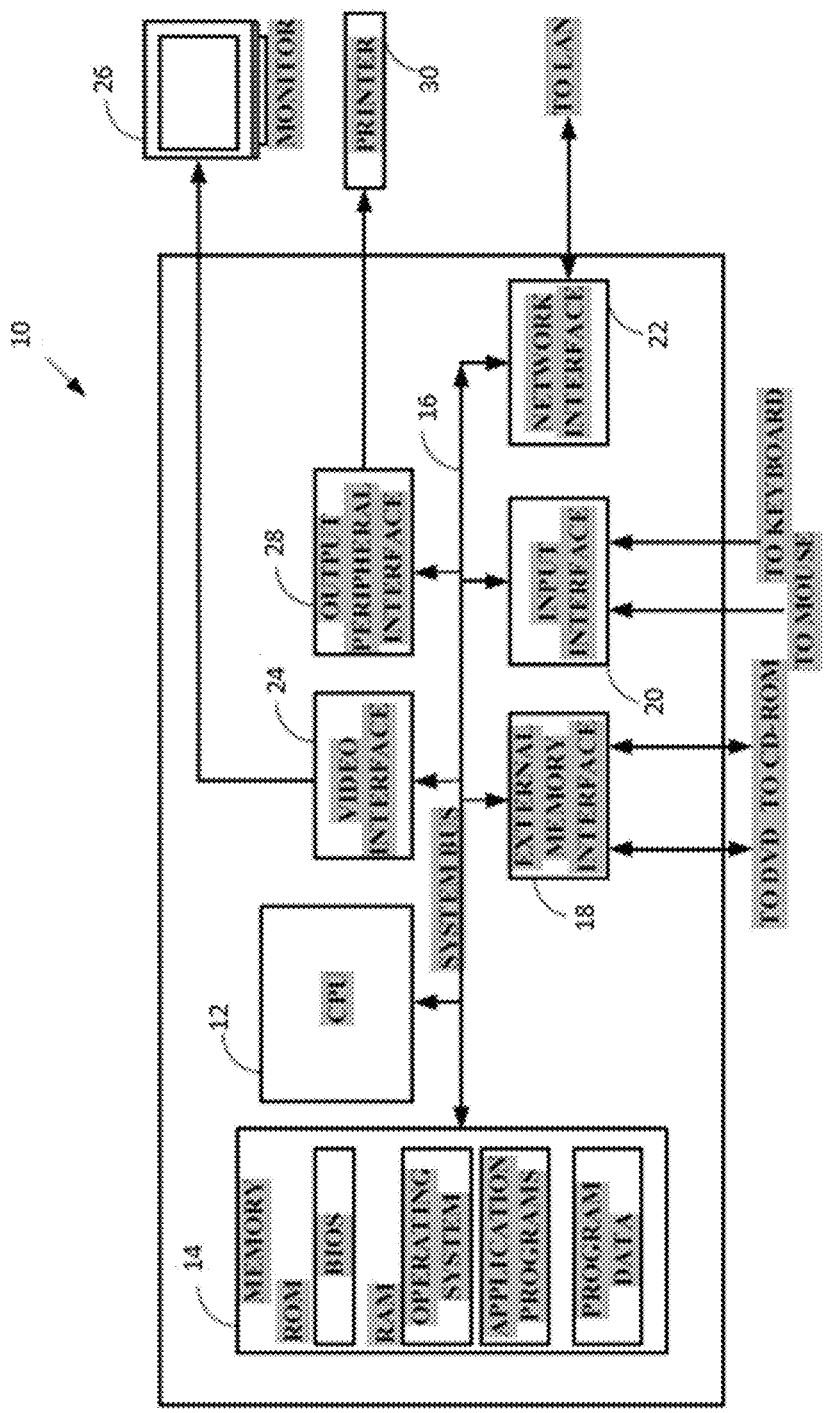
FIG. 7 depicts an exemplary computer system 10 comprising the structure for implementation of embodiments described above.

FIG. 7 depicts an exemplary computer system 10 comprising the structure for implementation of embodiments described above. Computer system 10 comprises a central processing unit (CPU) 12 that processes data stored in memory 14 exchanged via system bus 16. Memory 14 typically includes read-only memory, such as a built-in operating system, and random-access memory, which may include an operating system, application programs, and program data. Computer system 10 also comprises an external memory interface 18 to exchange data with a DVD or CD-ROM for example. Further, input interface 20 may serve to receive input from user input devices including but not limited to a keyboard and a mouse. Network interface 22 may allow external data exchange with a local area network (LAN) or other network, including the internet. Computer system 10 also typically comprises a video interface 24 for displaying information to a user via a monitor 26. An output peripheral interface 28 may output computational results and other information to output devices including but not limited to a printer 30.

Computer system 10 may comprise for example a personal computer or an engineering workstation, each of which is widely known in the art and is commonly used for integrated circuit design tasks, along with software products commercially available for performing computer-aided integrated circuit design tasks. Computer system 10 may also comprise a mobile computer, including for example a tablet computer or a smart phone. The computer system of FIG. 6 may for example receive program instructions, whether from existing software products or from embodiments of the present invention, via a computer program product and/or a network link to an external site.

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

We claim:

1. A method for identification of locations of defects in a circuit, the method comprising:
   applying, with a processor, a plurality of different defect analysis techniques to fault data associated with the circuit, wherein the plurality of defect analysis techniques includes per-fail scoring analysis, per-cycle scoring analysis, and per-pattern scoring analysis;
   performing, with the processor, a plurality of different defect identification techniques on the applied plurality of defect analysis techniques, wherein the plurality of defect identification techniques are selected from a group that includes (i) circuit topology based fail partitioning and (ii) software based fail partitioning;
   generating, with the processor, a defect report for each of the plurality of defect analysis techniques based on the performed defect identification techniques, wherein each defect report identifies at least one probable defect location;
   performing, with the processor, a fault analysis on each of the identified probable defect locations in the defect reports, wherein a same probable defect location identified in a plurality of the defect reports is ranked higher than a probable defect location identified in only one of the defect reports; and
   generating, with the processor, a report of the probable defect locations based on the fault analysis.

2. The method of claim 1, further comprising:
   prioritizing the probable defect locations according to the defect ranking technique.

3. The method of claim 1, wherein the performing of the plurality of defect identification techniques includes iterating each of the defect identification techniques for a predetermined time.

4. The method of claim 1, wherein the performing of the plurality of defect identification techniques includes each defect identification technique being iterated for a unique length of time.

5. The method of claim 1, wherein each of the plurality of defect analysis techniques is associated with a different weighting.

6. The method of claim 1, wherein each of the plurality of defect analysis techniques is associated with a different priority.

7. A non-transitory computer readable medium containing program instructions for a diagnostics system, wherein execution of the program instructions by one or more processors of a computer system causes one or more processors to perform the following:
apply a plurality of different defect analysis techniques to fault data associated with a circuit, wherein the plurality of defect analysis techniques includes per-fail scoring analysis, per-cycle scoring analysis, and per-pattern scoring analysis;
perform a plurality of different defect identification techniques on the applied plurality of defect analysis techniques, wherein the plurality of defect identification techniques are selected from a group that includes (i) circuit topology based fail partitioning and (ii) software based fail partitioning;
generate a defect report corresponding to each of the plurality of defect analysis techniques based on the performed defect identification techniques, wherein each defect report identifies at least one probable defect location;
perform a fault analysis on each of the identified probable defect locations in the defect reports, wherein a same probable defect location identified in a plurality of the defect reports is ranked higher than a probable defect location identified in only one of the defect reports; and
generate a report of the probable defect locations based on the fault analysis.

8. The non-transitory computer readable medium of claim 7, further comprising:
prioritizing the probable defect locations according to the defect ranking technique.

9. The non-transitory computer readable medium of claim 7, wherein the performing of the plurality of defect identification techniques includes iterating each of the defect identification techniques for a predetermined time.

10. The non-transitory computer readable medium of claim 7, wherein the performing of the plurality of defect identification techniques includes each defect identification technique being iterated for a unique length of time.

11. The non-transitory computer readable medium of claim 7, wherein each of the plurality of defect analysis techniques is associated with a different weighting.

12. The non-transitory computer readable medium of claim 7, wherein each of the plurality of defect analysis techniques is associated with a different priority.

13. An automatic test pattern generation (ATPG) system, the system comprising:
a processor, wherein the processor is configured to:
apply a plurality of different defect analysis techniques to fault data associated with a circuit, wherein the plurality of defect analysis techniques includes per-fail scoring analysis, per-cycle scoring analysis, and per-pattern scoring analysis;
perform a plurality of different defect identification techniques on the applied plurality of defect analysis techniques, wherein the plurality of defect identification techniques are selected from a group that includes (i) circuit topology based fail partitioning and (ii) software based fail partitioning;
generate a defect report corresponding to each of the plurality of defect analysis techniques based on the performed defect identification techniques, wherein each defect report identifies at least one probable defect location;
perform a fault analysis on each of the identified probable defect locations in the defect reports, wherein a same probable defect location identified in a plurality of the defect reports is ranked higher than a probable defect location identified in only one of the defect reports; and
generate a report of the probable defect locations based on the fault analysis.

14. The system of claim 13, wherein the plurality of defect analysis techniques are prioritized.

15. The system of claim 13, wherein the plurality of defect analysis techniques are weighted.

16. The method of claim 1, wherein:
for per-fail scoring analysis:
faults in the fault data are scored on a failure by failure basis,
a failure location in a test pattern is marked as explained only if a circuit fault results in a measurement value indicative of the circuit fault at the failure location and matches a faulty behavior of the circuit at the failure location in the test pattern, and
credit is given to a fault when it explains a failing location in the failing pattern;
for per-cycle scoring analysis:
faults in the fault data are scored on a cycle by cycle basis,
a set of failure locations measured in a single scan clock cycle in a test pattern is marked as explained only if all the failure locations match a faulty behavior of the circuit in the single scan clock cycle for the test pattern, and
credit is given to a fault when it explains all failures in the single scan clock cycle in the test pattern;
for per-pattern scoring analysis,
faults in the fault data are scored on a pattern by pattern basis,
a set of all the failure locations measured in a test pattern is marked as explained when all the failure locations match a faulty behavior of the circuit in the test pattern, and
credit is given to a fault when it explains all failures in the test pattern.

17. The computer readable medium of claim 7, wherein:
for per-fail scoring analysis:
faults in the fault data are scored on a failure by failure basis,
a failure location in a test pattern is marked as explained only if a circuit fault results in a measurement value indicative of the circuit fault at the failure location and matches a faulty behavior of the circuit at the failure location in the test pattern, and
credit is given to a fault when it explains a failing location in the failing pattern;
for per-cycle scoring analysis:
faults in the fault data are scored on a cycle by cycle basis,
a set of failure locations measured in a single scan clock cycle in a test pattern is marked as explained only if all the failure locations match a faulty behavior of the circuit in the single scan clock cycle for the test pattern, and
credit is given to a fault when it explains all failures in the single scan clock cycle in the test pattern;
for per-pattern scoring analysis,
faults in the fault data are scored on a pattern by pattern basis, a set of all the failure locations measured in a test pattern is marked as explained when all the failure locations match a faulty behavior of the circuit in the test pattern, and credit is given to a fault when it explains all failures in the test pattern.

18. The system of claim 13, wherein:

for per-fail scoring analysis:

faults in the fault data are scored on a failure by failure basis, a failure location in a test pattern is marked as explained only if a circuit fault results in a measurement value indicative of the circuit fault at the failure location and matches a faulty behavior of the circuit at the failure location in the test pattern, and credit is given to a fault when it explains a failing location in the failing pattern;

for per-cycle scoring analysis:

faults in the fault data are scored on a cycle by cycle basis, a set of failure locations measured in a single scan clock cycle in a test pattern is marked as explained only if all the failure locations match a faulty behavior of the circuit in the single scan clock cycle for the test pattern, and credit is given to a fault when it explains all failures in the single scan clock cycle in the test pattern;

for per-pattern scoring analysis, faults in the fault data are scored on a pattern by pattern basis, a set of all the failure locations measured in a test pattern is marked as explained when all the failure locations match a faulty behavior of the circuit in the test pattern, and credit is given to a fault when it explains all failures in the test pattern.

* * * * *